United States Patent
Jin et al.

(10) Patent No.: US 10,483,918 B2
(45) Date of Patent: *Nov. 19, 2019

(54) DOHERTY POWER AMPLIFIER FOR RADIO-FREQUENCY APPLICATIONS

(71) Applicant: SKYWORKS SOLUTIONS, INC., Woburn, MA (US)

(72) Inventors: Boshi Jin, Billerica, MA (US); Jing-Hwa Chen, Woburn, MA (US); Paul T. DiCarlo, Marlborough, MA (US); Steven Christopher Sprinkle, Hampstead, NH (US); Florinel G. Balteanu, Irvine, CA (US); David Scott Whitefield, Andover, MA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/716,493

(22) Filed: Sep. 26, 2017

(65) Prior Publication Data
US 2018/0278214 A1  Sep. 27, 2018

Related U.S. Application Data

(63) Continuation of application No. 14/806,577, filed on Jul. 22, 2015, now Pat. No. 9,774,300.

(Continued)

(51) Int. Cl.
*H03F 3/68* (2006.01)
*H03F 1/02* (2006.01)
(Continued)

(52) U.S. Cl.
CPC .......... *H03F 1/0288* (2013.01); *H03F 3/193* (2013.01); *H03F 3/211* (2013.01); *H03F 3/245* (2013.01);
(Continued)

(58) Field of Classification Search
CPC .......... H03F 5/00; H03F 3/45475; H03F 3/44; H03F 3/28; H03F 3/602; H03F 7/02;
(Continued)

(56) References Cited

U.S. PATENT DOCUMENTS 9,774,300 B2 * 9/2017 Jin .......................... H03F 3/245

FOREIGN PATENT DOCUMENTS

CN  104796089 A  7/2017

OTHER PUBLICATIONS

Zhao et al., "Analysis and Design of CMOS Doherty Power Amplifier Using Voltage Combining Method," 2013 IEEE International Wireless Symposium (IWS), Apr. 14-18, 2013.
(Continued)

*Primary Examiner* — Steven J Mottola
*Assistant Examiner* — Hafizur Rahman
(74) *Attorney, Agent, or Firm* — Chang & Hale LLP

(57) ABSTRACT

A power amplifier can include a carrier amplifier having first and second differential amplification cells with outputs coupled by a primary loop of a carrier transformer, and a peaking amplifier having first and second differential amplification cells with outputs coupled by a primary loop of a peaking transformer. The power amplifier can further include a combiner having a quarter-wave circuit implemented between the secondary loop of the carrier transformer and a secondary loop of the peaking transformer. The quarter-wave circuit can be configured to provide a characteristic impedance, such that the carrier and peaking amplifiers are presented with an impedance that is approximately the same as the characteristic impedance when both of the carrier and peaking amplifiers are turned on, and the carrier amplifier is presented with an impedance that is approximately twice the characteristic impedance when the carrier amplifier is turned on and the peaking amplifier is turned off.

19 Claims, 6 Drawing Sheets

Related U.S. Application Data

(60) Provisional application No. 62/028,018, filed on Jul. 23, 2014.

(51) Int. Cl.
  *H03F 3/193* (2006.01)
  *H03F 3/21* (2006.01)
  *H03F 3/24* (2006.01)
  *H03F 3/60* (2006.01)
  *H03F 3/72* (2006.01)

(52) U.S. Cl.
  CPC .............. *H03F 3/604* (2013.01); *H03F 3/72* (2013.01); *H05K 999/99* (2013.01); *H03F 2200/111* (2013.01); *H03F 2200/451* (2013.01); *H03F 2203/21106* (2013.01); *H03F 2203/7209* (2013.01); *H03F 2203/7221* (2013.01)

(58) Field of Classification Search
  CPC .......... H03F 3/45085; H03F 3/26; H03F 1/14; H03F 3/21; H03F 2200/372; H03F 3/68; H03F 1/0288; H03G 1/0023; H03G 1/0088; H01L 2924/3011
  USPC ... 330/3, 69, 74, 116, 117, 124 R, 134, 252, 330/254, 262, 275, 284, 292, 295, 301, 330/307
  See application file for complete search history.

(56) References Cited

OTHER PUBLICATIONS

Ryu et al., "CMOS Doherty Amplifier With Variable Balun Transformer and Adaptive Bias Control for Wireless LAN Application," IEEE Journal of Solid-State Circuits, vol. 49, No. 6, June 2014, pp. 1356-1365.

Ta et al., "Wireless communications at 60 GHz: A single-chip solution on CMOS technology," Mobile and Wireless communications Network Layer and Circuit Level Design, InTech, Jan. 2010, pp. 281-304.

Luong, "Mobile Phone circuits to get even smaller," Research frontiers Newsletter, May, 2004.

* cited by examiner

DOHERTY POWER AMPLIFIER FOR RADIO-FREQUENCY APPLICATIONS

CROSS-REFERENCE TO RELATED APPLICATION(S)

This application is a continuation of U.S. application Ser. No. 14/806,577 filed Jul. 22, 2015, entitled TRANSFORMER-BASED DOHERTY POWER AMPLIFIER, which claims priority to and the benefit of the filing date of U.S. Provisional Application No. 62/028,018 filed Jul. 23, 2014, entitled TRANSFORMER-BASED DOHERTY CMOS POWER AMPLIFIER, the benefits of the filing dates of which are hereby claimed and the disclosures of which are hereby expressly incorporated by reference herein in their entirety.

BACKGROUND

Field

The present disclosure relates to Doherty power amplifiers.

Description of the Related Art

A Doherty power amplifier (PA) typically includes two amplification paths. The first amplification path typically includes a carrier PA, and the second amplification path typically includes a peaking PA. An input radio-frequency (RF) signal is typically split between the two amplification paths. After the split RF signals are amplified in their respective amplification paths, they are combined so as to yield an amplified RF signal as an output.

In such a Doherty PA, both of the carrier and peaking PAs typically operate when the input RF signal peaks. As input RF signal decreases in power, the peaking PA typically turns off while the carrier PA operates. Such operating modes can result in efficient power amplification in many wireless applications.

SUMMARY

According to a number of implementations, the present disclosure relates to a Doherty power amplifier (PA) that includes a carrier amplification path having an output that includes a carrier transformer, and a peaking amplification path having an output that includes a peaking transformer. The Doherty PA further includes a combiner configured to combine the outputs of the carrier and peaking amplification paths into an output node. The combiner includes a quarter-wave circuit implemented between the carrier and peaking transformers.

In some embodiments, the combiner can be a voltage combiner. Each of the carrier and peaking transformers can include a primary loop and a secondary loop. Each of the carrier and peaking amplification paths can include a first PA cell and a second PA cell. The first and second PA cells can be configured as differential PA cells. Outputs of the first and second PA cells of the respective amplification path can be coupled by the corresponding primary loop. The quarter-wave circuit can couple first ends of the secondary loops of the carrier and peaking transformers. A second end of the secondary loop of the carrier transformer can be coupled to the output node. A second end of the secondary loop of the peaking transformer can be coupled to a ground.

In some embodiments, each of the first and second PA cells can include a plurality of transistors arranged in a stack. In some embodiments, each of the first and second PA cells can be implemented as a CMOS PA. In some embodiments, the quarter-wave circuit can include an inductance L having first and second ends coupled to the secondary loops of the carrier and peaking transformers, respectively, a first capacitance C1 implemented between the first end of L and a ground, and a second capacitance C2 implemented between the second end of L and the ground. C1 and C2 can have values that are substantially the same.

In some implementations, the present disclosure relates to a radio-frequency (RF) module having a packaging substrate configured to receive a plurality of components, and a Doherty power amplifier (PA) implemented on the packaging substrate. The Doherty PA includes a carrier amplification path having an output that includes a carrier transformer and a peaking amplification path having an output that includes a peaking transformer. The Doherty PA further includes a combiner configured to combine the outputs of the carrier and peaking amplification paths into an output node. The combiner includes a quarter-wave circuit implemented between the carrier and peaking transformers.

In some embodiments, the RF module can be a PA module. In some embodiments, the RF module can be a front-end module.

In some embodiments, at least some of the Doherty PA can be implemented on a CMOS die. The RF module can further include a bias circuit configured to provide bias signals to the carrier and peaking amplification paths.

In accordance with some teachings, the present disclosure relates to a wireless device having a transceiver configured to generate a radio-frequency (RF) signal, and a power amplifier (PA) system configured to amplify the RF signal. The PA system includes a Doherty PA with a carrier amplification path having an output that includes a carrier transformer and a peaking amplification path having an output that includes a peaking transformer. The Doherty PA further includes a combiner configured to combine the outputs of the carrier and peaking amplification paths into an output node. The combiner includes a quarter-wave circuit implemented between the carrier and peaking transformers. The wireless device further includes an antenna in communication with the output node of the Doherty PA and configured to facilitate transmission of the amplified RF signal.

In some embodiments, the wireless device can be, for example, a cellular phone.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Figure 1:
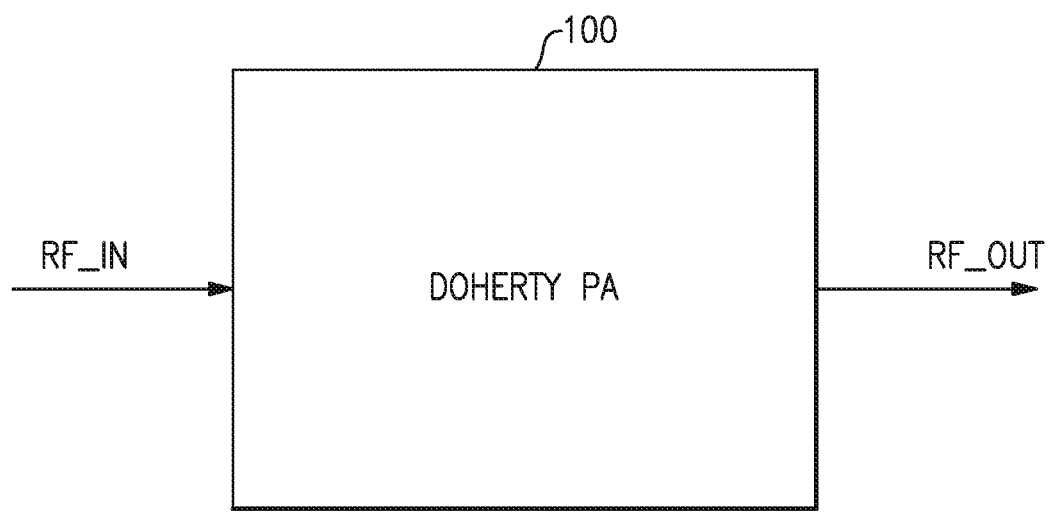
FIG. 1 shows a block diagram of a Doherty power amplifier (PA) that can be configured to include one or more features as described herein.

FIG. 1 shows a block diagram of a Doherty power amplifier (PA) 100 that can be configured to include one or more features as described herein. Such a PA can amplify the power of an input radio-frequency (RF) signal (RF_IN) to generate an amplified RF signal (RF_OUT) that can be transmitted.

As described herein, the Doherty PA 100 if FIG. 1 can be implemented as a voltage-combined Doherty CMOS PA. Although described in such a CMOS context, it will be understood that one or more features of the present disclosure can also be implemented in other types of process technologies.

As described herein, signals processed through carrier and peaking PAs can be combined through a voltage combiner and a quarter wave-length circuit at a secondary loop. Characteristic impedance of an impedance transformation circuit can be approximately equal with an optimum load impedance (Ropt) for peaking and carrier PAs, and the carrier PA's loadline can be increased to, for example, two times of Ropt when the peaking PA is turned off at back-off power; therefore, the efficiency can be enhanced accordingly. Examples of designs having such features are simulated in 0.18 μm SOI process, and the simulation results indicate that power-added efficiency (PAE) can be improved by 10% at 26 dBm output power, when compared with a conventional Class AB PA at 1.85 GHz.

It is noted that many wireless communication systems experience increases in information content, which typically leads to modulation systems that need to operate with wider bandwidths and higher crest factors. Doherty power amplification techniques are popular schemes for high-efficiency operation at a back-off power region. Doherty PAs can amplify modulated signals with high crest factors efficiently, since only approximately half of a power cell is operated in a low power region.

It is also noted that integrating a Doherty architecture into a single chip is typically challenging, since the architecture normally utilizes an input coupler and a quarter-wavelength transformer, which are typically bulky. When implemented in a differential CMOS PA application, one typically needs to design a quarter wavelength transformation circuits for each cell, and such an implementation can be difficult to achieve.

Described herein are examples related to a voltage combined Doherty PA, which can be implemented with a quarter wave-length transformation circuit in the secondary loop of a transformer. Such a configuration can avoid complicated designs and be very suitable for voltage combined transformer-based PAs such as CMOS PAs.

Figure 2:
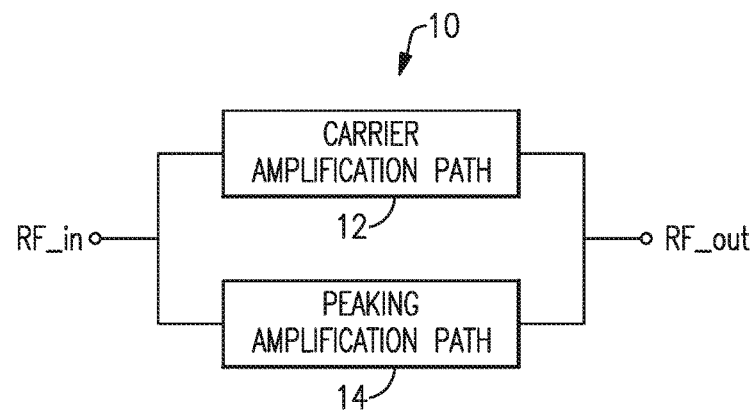
FIG. 2 shows a general configuration of a Doherty PA implemented to receive an input radio-frequency (RF) signal and generate an amplified RF signal.

FIG. 2 shows a general configuration of a Doherty PA 10 implemented to receive an input RF signal (RF_in) and generate an amplified RF signal (RF_out). The input RF signal is shown to be split into a carrier amplification path 12 and a peaking amplification path 14. Processed RF signals from such amplification paths are shown to be combined so as to yield RF_out.

Figure 3:
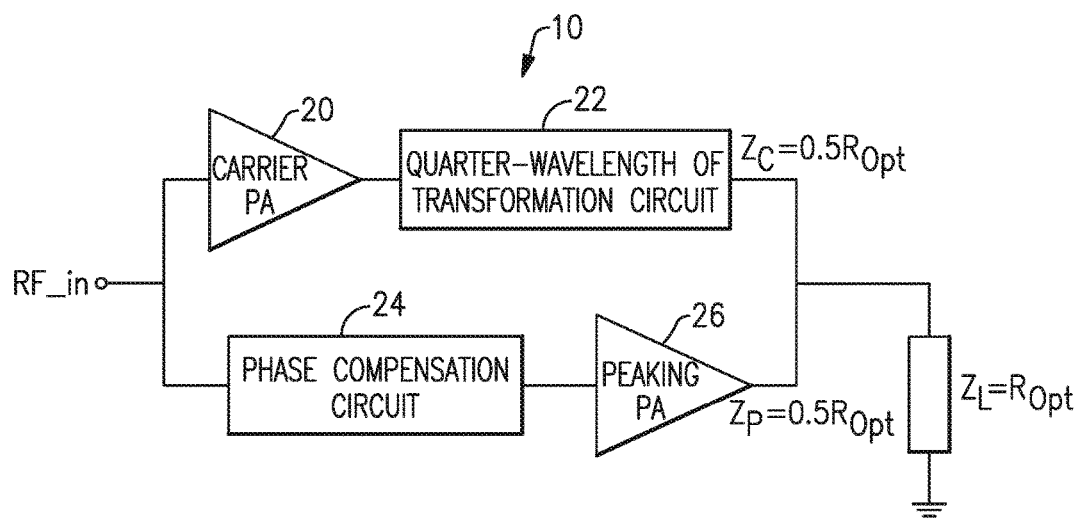
FIG. 3 shows an example of a Doherty PA where signals associated with carrier and peaking PAs are combined with a current-combining approach.

FIG. 3 shows an example of a Doherty PA 10, where signals associated with the carrier and peaking PAs are combined with a current-combining approach. For example, the carrier amplification path can include a carrier PA 20 followed by a quarter-wavelength of a transformation circuit 22; and the peaking amplification path can include a phase compensation circuit 24 followed by a peaking PA 26. The combined output of the carrier and peaking amplification paths is shown to be coupled to a load having an optimum impedance ($Z_L = R_{Opt}$).

Configured in the foregoing manner, each amplification path presents approximately half of the load impedance ($Z_L$) at the common node. For example, the carrier amplification path presents an impedance of $Z_C = 0.5\ R_{Opt}$, and the peaking amplification path presents an impedance of $Z_P = 0.5\ R_{Opt}$. Therefore, back-off efficiency may not be improved significantly in cellular PA applications. For example, when implemented as CMOS PAs, numerous transformation circuits in the current combining approach can cause amplitude and phase imbalance and deteriorate the efficiency and linearity.

Figure 4:
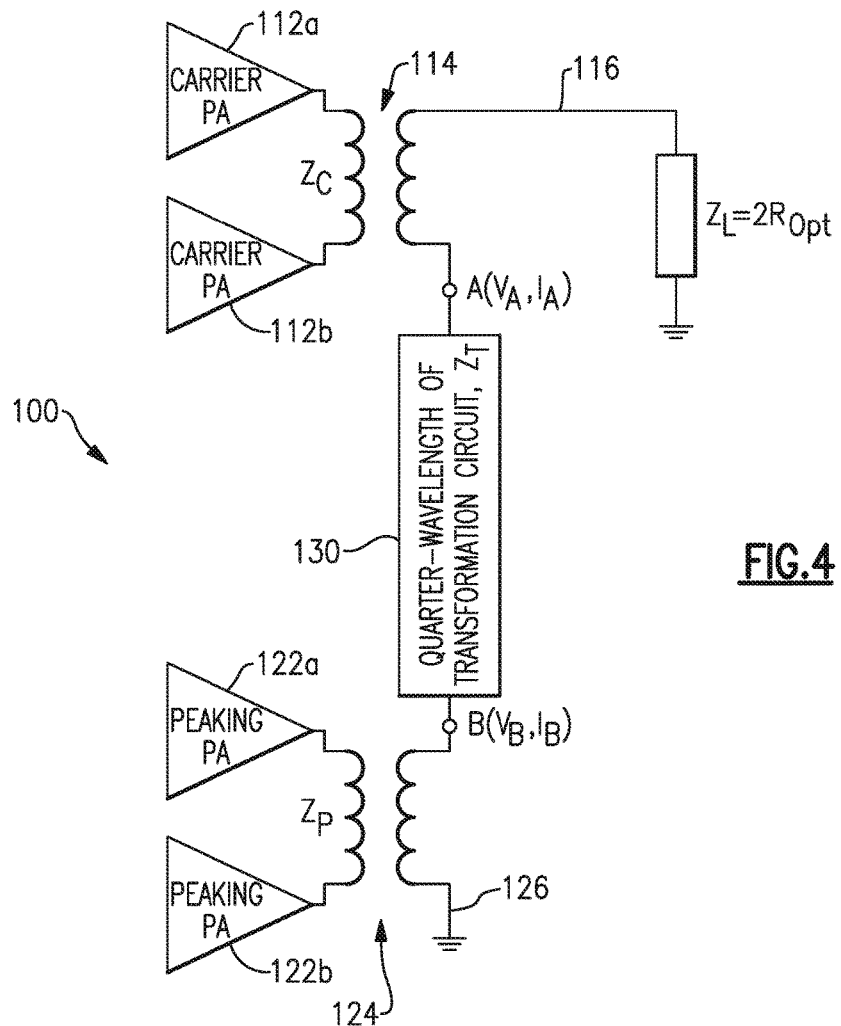
FIG. 4 shows an example of a Doherty PA having one or more features as described herein.

FIG. 4 shows an example of a Doherty PA 100 where each of the carrier PA and peaking PA can include differential PA cells. For example, the carrier PA is shown to include PA cells 112a, 112b, and the outputs of such PA cells are shown to be coupled by a primary loop of a carrier transformer 114. Similarly, the peaking PA is shown to include PA cells 122a, 122b, and the outputs of such PA cells are shown to be coupled by a primary loop of a peaking transformer 124.

A secondary loop of the carrier transformer 114 is shown to be coupled with a secondary loop of the peaking transformer 124 through a quarter-wavelength circuit 130. In the example of FIG. 4, such a quarter-wavelength circuit is shown to be implemented between node A (of the carrier transformer 114) and node B (of the peaking transformer 124). Associated with node A are voltage $V_A$ and current $I_A$. Similarly, voltage $V_B$ and $I_B$ are associated with node B.

In the example of FIG. 4, node A and an output node 116 can form the two ends of the secondary loop of the carrier transformer 114. Node B and a ground node 126 can form the two ends of the secondary loop of the peaking transformer 124. In some embodiments, the carrier PA can be implemented closer to the RF output node 116 than the peaking PA. Accordingly, the peaking PA can be implemented closer to the ground node 126 than the carrier PA.

Referring to FIG. 4, it is noted that a load impedance seen by carrier ($Z_c$) and peaking ($Z_p$) PA can be represented as follows:

$$Z_c = \frac{Z_T^2}{R_L} \frac{V_{out}}{V_{out} - V_B}, \qquad (1)$$

-continued $$Z_p = \frac{V_B}{V_{out}} Z_L. \quad (2)$$

where $Z_T$ is the characteristic impedance of the quarter-wavelength circuit 130, and $R_L$ is the load impedance at the output of secondary loop. Hence, if $V_B$ is changed with the output power, the load impedance seen by carrier PA can be modulated dynamically and behave as Doherty PA performance.

Assuming the carrier PA operates at Class A bias and the peaking PA operates at Class B bias, each PA's optimum load impedance can be $R_{opt}$. Accordingly, $I_{max}$ can be a maximum current at saturated power, and $V_{max}$ can be a maximum voltage swing of each PA.

Referring to FIG. 4, it is further noted that the currents at node A and B can be express as follows:

$$I_A = \frac{1}{4}(1+\alpha)I_{max}, \quad (3)$$

$$I_B = \frac{1}{2}\alpha I_{max}. \quad (4)$$

where $\alpha$ can vary between 0 and 1. When the peaking PA is turned off, $\alpha=0$; and when the peaking PA is PA is turned on, $\alpha=1$.

A relationship of current and voltage at nodes A and B can be expressed as follows, in terms of quarter-wavelength load impedance transformation:

$$\frac{V_A}{I_A}\frac{V_B}{I_B} = Z_T^2. \quad (5)$$

Assuming that power is generally constant at nodes A and B ($V_A I_A = V_B I_B$), Equation 5 can be simplifies as $$Z_T = \frac{V_B}{I_A} = \frac{V_A}{I_B}. \quad (6)$$

Hence, the carrier and peaking PAs' load line impedances can be expressed as:

$$Z_c = \frac{V_{out} - V_A}{V_{out}} Z_L, \quad (7)$$

$$Z_p = \frac{V_B}{V_{out}} Z_L. \quad (8)$$

Accordingly, the carrier PA's voltage swing can be expressed as:

$$V_c = Z_c I_A = \frac{V_{out} - V_A}{V_{out}} Z_L \frac{1}{4}(1+\alpha)I_{max} \quad (9)$$
$$= \frac{V_{out} - Z_T I_B}{V_{out}} Z_L \frac{1}{4}(1+\alpha)I_{max}$$
$$= \left(1 - \frac{Z_T}{V_{max}}\frac{1}{2}\alpha\right) Z_L \frac{1}{4}(1+\alpha)I_{max}.$$

It is noted that when carrier and peaking amplifications operate at optimum load impedance matching, $Z_L = 2R_{opt}$, with $$R_{opt} = \frac{V_{max}}{I_{max}}$$

for Class A bias operation. The voltage swing of the carrier PA can be expressed further as:

$$V_c = I_{max} R_{opt} \left(1 + \alpha - \frac{Z_T}{2R_{opt}}\alpha - \frac{Z_T}{2R_{opt}}\alpha^2\right). \quad (10)$$

From the foregoing examples, one can observe that if $V_c$ can be substantially maintained with high voltage swing, efficiency can be improved at back-off power. Assuming or setting a condition where $\text{diff}(V_{12})=0$, one can express ZT as:

$$Z_T = R_{opt}. \quad (11)$$

From the foregoing examples, one can see that the carrier and peaking PAs will see $R_{opt}$ at maximum power when both of the carrier and peaking PAs are turned on, and carrier PA will see $2R_{opt}$ when the peaking PA is turned off at, for example, 6 dB back-off power. Accordingly, efficiency of the Doherty PA 100 can be improved.

In some embodiments, the Doherty PA 100 of FIG. 4 can be implemented in a number of process technologies, including silicon-on-insulator (SOI) process technology. For example, the PA cells 112*a*, 112*b*, 122*a*, 122*b* can be implemented in SOI 0.18 µm process to operate at one or more frequencies or frequency ranges (e.g., at 1.85 GHz). It will be understood that one or more features of the present disclosure can be implemented with other process technologies, dimensions, and/or operating frequencies.

Figure 5:
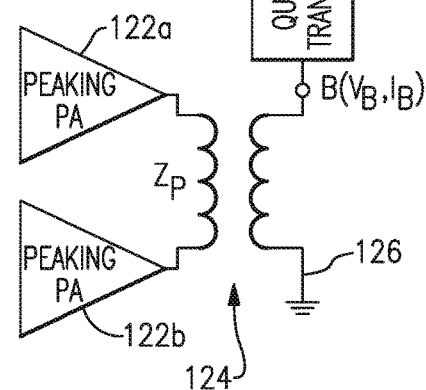
FIG. 5 shows that in some embodiments, a PA cell in the Doherty PA of FIG. 4 can be implemented as a stack of transistors to sustain high voltage swings.

FIG. 5 shows that in some embodiments, each of the PA cells (112*a*, 112*b*, 122*a* or 122*b*) can be implemented as, for example, a three-stack thick transistors to sustain high voltage swings at high load-lines. In another example, a total gate width of 18 µm can be supplied with approximately 3.4V. It will be understood that one or more features of the present disclosure can be implemented with stack sizes, gate dimensions, and/or operating voltages.

In some embodiments, the carrier PA can be biased at light Class AB, and the peaking can be biased at deep Class AB (e.g., more close to Class B). It will be understood that other biasing configurations can also be implemented.

Figure 6:
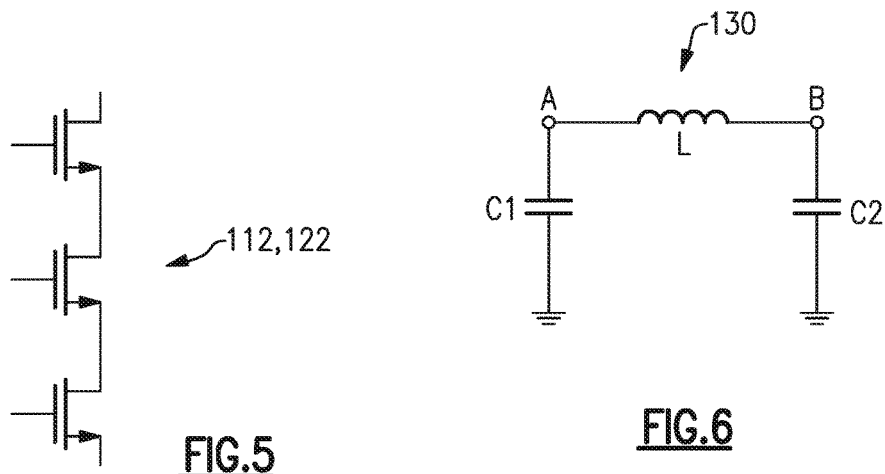
FIG. 6 shows an example of the quarter-wavelength circuit of FIG. 4.

FIG. 6 shows that in some embodiments, the quarter-wavelength circuit 130 of FIG. 4 can be implemented as a pi-network, with an inductance L between the nodes A and B, and a capacitance (C1 or C2) that couples each of the nodes A and B to ground. For the foregoing examples of design and/or operating parameters, the inductance L can be an inductor having a value of approximately 4 nH, and each of the capacitances C1, C2 can be a lumped capacitor having a value of approximately 9 pF. It will be understood that other values of L, C1 and/or C2 can be implemented, depending on designs. It will also be understood that other quarter-wavelength circuits can be implemented. Further, although various examples are described herein in the context of a quarter-wavelength coupling between the carrier and peaking transformers, it will be understood that one or more features of the present disclosure can also be implemented in other wavelength related couplings.

Figure 7:
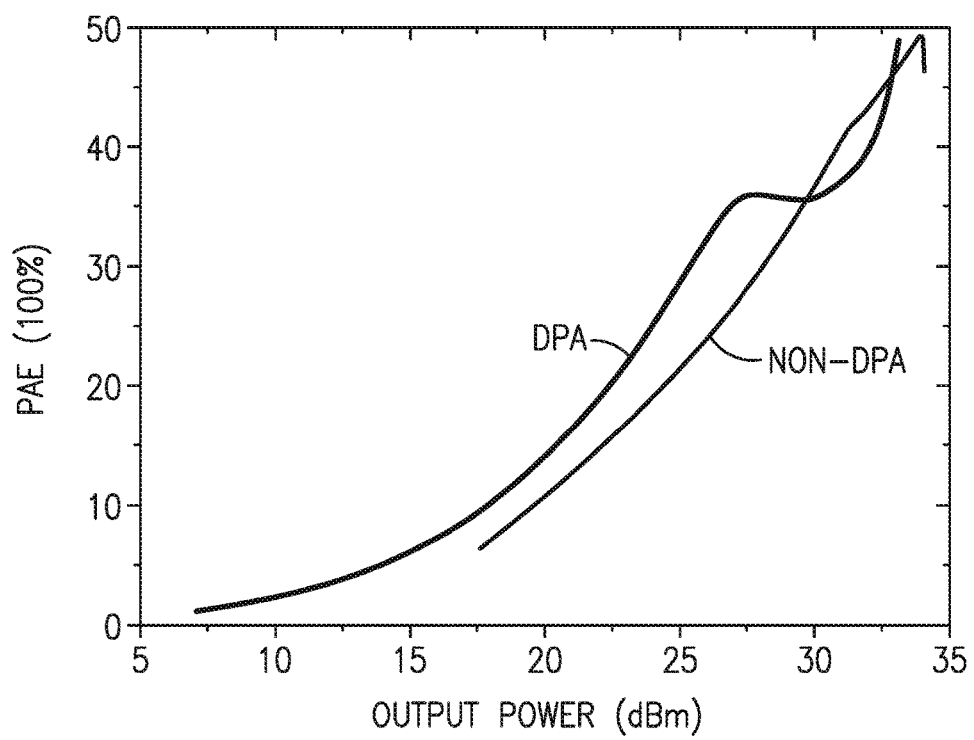
FIG. 7 shows an example of a simulated power-added efficiency (PAE) curve for the Doherty PA of FIG. 4.

FIG. 7 shows an example of simulated PAE curves for the Doherty PA 100 of FIGS. 4-6 ("DPA" curve), and for a conventional Class AB PA ("Non-DPA" curve). One can see that at about 26 dBm output power, the DPA can achieve a PAE of about 35%, which is an improvement of about 10% over the Non-DPA PAE value.

Figure 8:
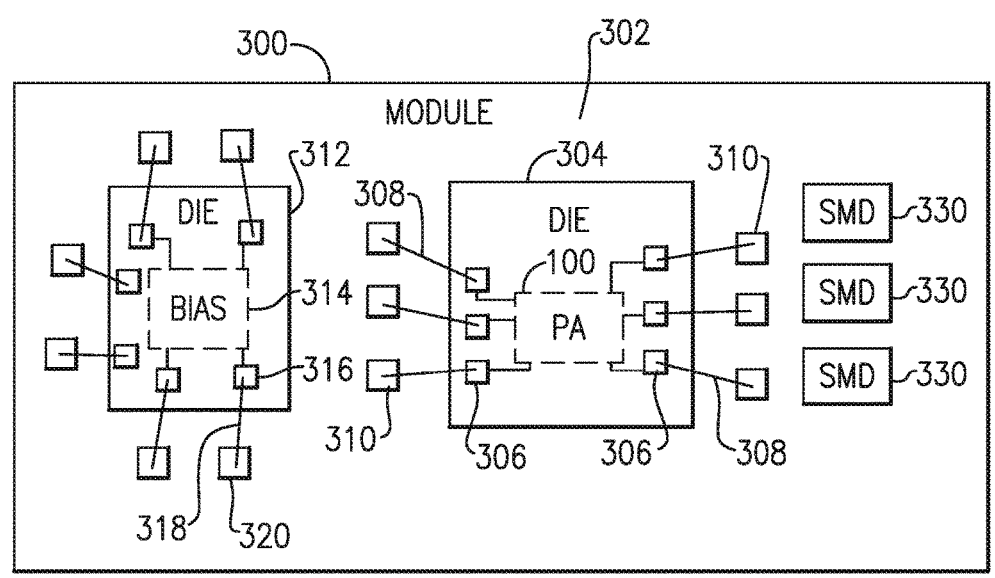
FIG. 8 shows that in some embodiments, a Doherty PA having one or more features as described herein can be implemented in a module.

FIG. 8 shows that in some embodiments, a Doherty PA having one or more features as described herein can be implemented in a module such as a PA module (PAM) or a front-end module (FEM). In the example of FIG. 8, a module 300 is shown to include a Doherty PA 100 having one or more features as described herein. In some embodiments, such a PA can be implemented in a PA die 304. Such a die can be, for example, a CMOS die.

In the example of FIG. 8, a biasing circuit 314 is depicted as being implemented on a separate die 312. However, it will be understood that the PA 100 and the biasing circuit 314 can be configured in other manners (e.g., on a common die).

In the example module 300 of FIG. 8, the die 304, 312 are shown to be mounted on a packaging substrate 302. The die 304 can include a plurality of electrical contact pads 306 configured to allow formation of electrical connections 308 such as wirebonds between the die 304 and contact pads 310 formed on the packaging substrate 302. Similarly, the die 312 can include a plurality of electrical contact pads 316 configured to allow formation of electrical connections 318 such as wirebonds between the die 312 and contact pads 320 formed on the packaging substrate 302.

The packaging substrate 302 can be configured to receive a plurality of components such as the die 304, 312 and one or more SMDs (e.g., 320). In some embodiments, the packaging substrate 302 can include, for example, a laminate substrate.

In some embodiments, the module 300 can also include one or more packaging structures to, for example, provide protection and facilitate easier handling of the module 300. Such a packaging structure can include an overmold formed over the packaging substrate 302 and dimensioned to substantially encapsulate the various circuits and components thereon.

It will be understood that although the module 300 is described in the context of wirebond-based electrical connections, one or more features of the present disclosure can also be implemented in other packaging configurations, including flip-chip configurations.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 9:
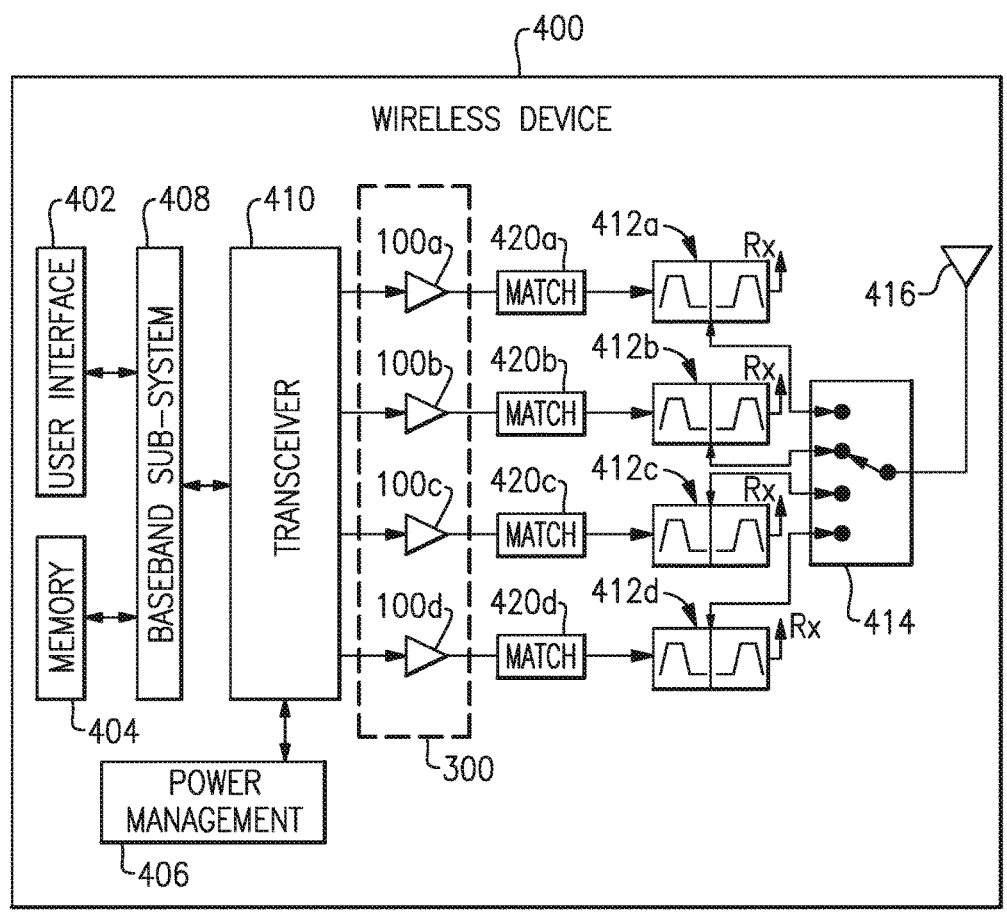
FIG. 9 depicts an example wireless device having one or more advantageous features described herein.

FIG. 9 depicts an example wireless device 400 having one or more advantageous features described herein. In the example of FIG. 9, one or more PAs 100 can include one or more features as described herein. Such PAs can facilitate, for example, multi-band operation of the wireless device 400. In embodiments where the PAs are packaged into a module, such a module can be represented by a dashed box 300.

The PAs 100 can receive their respective RF signals from a transceiver 410 that can be configured and operated to generate RF signals to be amplified and transmitted, and to process received signals. The transceiver 410 is shown to interact with a baseband sub-system 408 that is configured to provide conversion between data and/or voice signals suitable for a user and RF signals suitable for the transceiver 410. The transceiver 410 is also shown to be connected to a power management component 406 that is configured to manage power for the operation of the wireless device 400. Such power management can also control operations of other parts of the module 300.

The baseband sub-system 408 is shown to be connected to a user interface 402 to facilitate various input and output of voice and/or data provided to and received from the user. The baseband sub-system 408 can also be connected to a memory 404 that is configured to store data and/or instructions to facilitate the operation of the wireless device 400, and/or to provide storage of information for the user.

In the example wireless device 400, outputs of the PAs 100 are shown to be matched (via match circuits 420) and routed to an antenna 416 via their respective duplexers 412a-412d and a band-selection switch 414. The band-selection switch 414 can be configured to allow selection of an operating band. In some embodiments, each duplexer 412 can allow transmit and receive operations to be performed simultaneously using a common antenna (e.g., 416). In FIG. 9, received signals are shown to be routed to "Rx" paths (partially shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplifier comprising:
   a carrier amplifier having first and second differential amplification cells with outputs coupled by a primary loop of a carrier transformer;
   a peaking amplifier having first and second differential amplification cells with outputs coupled by a primary loop of a peaking transformer;
   a combiner including a quarter-wave circuit implemented between a first end of a secondary loop of the carrier transformer and a first end of a secondary loop of the peaking transformer, the quarter-wave circuit configured such that the carrier and peaking amplifiers are presented with a desired impedance when both of the carrier and peaking amplifiers are turned on, and the carrier amplifier is presented with an impedance that is approximately twice the desired impedance when the carrier amplifier is turned on and the peaking amplifier is turned off; and
   an output node implemented at a second end of the secondary loop of the carrier transformer.

2. The power amplifier of claim 1 wherein the desired impedance includes a characteristic impedance of the quarter-wave circuit.

3. The power amplifier of claim 1 wherein the carrier amplifier is configured to operate with a light Class AB bias, and the peaking amplifier is configured to operate with a deep Class AB bias.

4. The power amplifier of claim 1 wherein a second end of the secondary loop of the peaking transformer is coupled to a ground.

5. The power amplifier of claim 1 wherein the quarter-wave circuit includes an inductance L implemented between the secondary loops of the carrier and peaking transformers, a first capacitance C1 implemented between a first end of the inductance and a ground, and a second capacitance C2 implemented between a second end of the inductance and the ground.

6. The power amplifier of claim 5 wherein the first capacitance and the second capacitance have values that are approximately the same.

7. The power amplifier of claim 1 wherein each of the first and second differential amplification cells of the carrier amplifier and the peaking amplifier includes a plurality of transistors arranged in a stack.

8. The power amplifier of claim 1 wherein each of the first and second differential amplification cells of the carrier amplifier and the peaking amplifier is implemented as a complementary metal-oxide-semiconductor power amplifier.

9. The power amplifier of claim 1 wherein the carrier amplifier and the peaking amplifier are implemented as silicon-on-insulator devices.

10. The power amplifier of claim 1 wherein the combiner is implemented as a voltage combiner.

11. The power amplifier of claim 1 wherein the carrier amplifier is configured to operate with a Class A bias, and the peaking amplifier is configured to operate with a Class B bias.

12. A radio-frequency module comprising:
    a packaging substrate configured to receive a plurality of components; and
    a power amplifier implemented on the packaging substrate and including a carrier amplifier having first and second differential amplification cells with outputs coupled by a primary loop of a carrier transformer, and a peaking amplifier having first and second differential amplification cells with outputs coupled by a primary loop of a peaking transformer, the power amplifier further including a combiner having a quarter-wave circuit implemented between a first end of a secondary loop of the carrier transformer and a first end of a secondary loop of the peaking transformer, the quarter-wave circuit configured such that the carrier and peaking amplifiers are presented with a desired impedance when both of the carrier and peaking amplifiers are turned on, and the carrier amplifier is presented with an impedance that is approximately twice the desired impedance when the carrier amplifier is turned on and the peaking amplifier is turned off, the power amplifier further including an output node implemented at a second end of the secondary loop of the carrier transformer.

13. The radio-frequency module of claim 12 further comprising a bias circuit configured to provide bias signals to the carrier and peaking amplifiers.

14. The radio-frequency module of claim 12 wherein the radio-frequency module is a power amplifier module.

15. The radio-frequency module of claim 12 wherein the radio-frequency module is a front-end module.

16. The radio-frequency module of claim 12 wherein at least some of the power amplifier is implemented on a complementary metal-oxide-semiconductor die.

17. The radio-frequency module of claim 12 wherein at least some of the power amplifier is implemented on a silicon-on-insulator die.

18. A wireless device comprising:
    a transmitter circuit configured to generate a signal;
    a power amplifier configured to amplify the signal, and including a carrier amplifier having first and second differential amplification cells with outputs coupled by a primary loop of a carrier transformer, and a peaking amplifier having first and second differential amplification cells with outputs coupled by a primary loop of a peaking transformer, the power amplifier further including a combiner having a quarter-wave circuit implemented between a first end of a secondary loop of the carrier transformer and a first end of a secondary loop of the peaking transformer, the quarter-wave circuit configured such that the carrier and peaking amplifiers are presented with a desired impedance when both of the carrier and peaking amplifiers are turned on, and the carrier amplifier is presented with an impedance that is approximately twice the desired impedance when the carrier amplifier is turned on and the peaking amplifier is turned off, the power amplifier further including an output node implemented at a second end of the secondary loop of the carrier transformer; and
    an antenna in communication with the output node of the power amplifier and configured to support transmission of the amplified signal.

19. The wireless device of claim 18 wherein the power amplifier is configured to amplify the signal having a cellular frequency.

\* \* \* \* \*